(12) United States Patent
Park et al.

(10) Patent No.: US 9,356,116 B2
(45) Date of Patent: May 31, 2016

(54) POWER SEMICONDUCTOR DEVICE AND METHOD OF FABRICATING THE SAME

(71) Applicant: SAMSUNG ELECTRO-MECHANICS CO., LTD., Suwon (KR)

(72) Inventors: Jaehoon Park, Suwon (KR); In Hyuk Song, Suwon (KR); Dong Soo Seo, Suwon (KR); Kwang Soo Kim, Suwon (KR); Kee Ju Um, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 178 days.

(21) Appl. No.: 13/890,680

(22) Filed: May 9, 2013

(65) Prior Publication Data

US 2014/0239344 A1    Aug. 28, 2014

(30) Foreign Application Priority Data

Feb. 26, 2013    (KR) .................. 10-2013-0020713

(51) Int. Cl.
*H01L 29/66* (2006.01)
*H01L 29/739* (2006.01)
(Continued)

(52) U.S. Cl.
CPC ...... *H01L 29/66348* (2013.01); *H01L 29/7397* (2013.01); *H01L 27/088* (2013.01); *H01L 27/0817* (2013.01); *H01L 27/0921* (2013.01); *H01L 29/0847* (2013.01); *H01L 29/1033* (2013.01); *H01L 29/1079* (2013.01); *H01L 29/41733* (2013.01); *H01L 29/4232* (2013.01); *H01L 29/66325* (2013.01); *H01L 29/66333* (2013.01); *H01L 29/66477* (2013.01); *H01L 29/66484* (2013.01); *H01L 29/66954* (2013.01); *H01L 29/7393* (2013.01);*H01L 29/768* (2013.01); *H01L 29/78* (2013.01); *H01L 31/111* (2013.01); *H01L 31/1113* (2013.01); *H01L 51/0512* (2013.01)

(58) Field of Classification Search
None
See application file for complete search history.

(56) References Cited

U.S. PATENT DOCUMENTS 4,789,560 A     12/1988   Yen
5,894,149 A *   4/1999    Uenishi ............... H01L 29/0653
                                                      257/129

(Continued)

FOREIGN PATENT DOCUMENTS

CN     1726587      1/2006
JP     2007-110071  4/2007

(Continued)

OTHER PUBLICATIONS

Korean Office Action mailed Feb. 17, 2014 in corresponding Korean Application No. 10-2013-0020713.

(Continued)

*Primary Examiner* — David Vu
*Assistant Examiner* — Juanita Rhodes

(57) ABSTRACT

There is provided a power semiconductor device, including a first conductive type drift layer; a second conductive type body layer formed on the drift layer, a second conductive type collector layer formed below the drift layer; a first gate formed by penetrating through the body layer and a portion of the drift layer, a first conductive type emitter layer formed in the body layer and formed to be spaced apart from the first gate, a second gate covering upper portions of the body layer and the emitter layer and formed as a flat type gate on the first gate, and a segregation stop layer formed between contact surfaces of the first and second gates with the body layer, the emitter layer, and the drift layer.

16 Claims, 7 Drawing Sheets

(51) Int. Cl.
| | |
|---|---|
| *H01L 27/088* | (2006.01) |
| *H01L 29/08* | (2006.01) |
| *H01L 29/10* | (2006.01) |
| *H01L 29/417* | (2006.01) |
| *H01L 29/423* | (2006.01) |
| *H01L 29/768* | (2006.01) |
| *H01L 29/78* | (2006.01) |
| *H01L 51/05* | (2006.01) |
| *H01L 27/08* | (2006.01) |
| *H01L 27/092* | (2006.01) |
| *H01L 31/111* | (2006.01) |

(56) References Cited

U.S. PATENT DOCUMENTS

| | | |
|---|---|---|
| 6,303,410 B1 | 10/2001 | Baliga |
| 2002/0167046 A1* | 11/2002 | Aoki ............... H01L 21/28194 257/330 |
| 2004/0041207 A1* | 3/2004 | Takano ............... H01L 29/7813 257/330 |
| 2006/0001084 A1 | 1/2006 | Kelly et al. |
| 2011/0316071 A1 | 12/2011 | Hatori |
| 2012/0153382 A1 | 6/2012 | Narazaki et al. |

FOREIGN PATENT DOCUMENTS

| | | |
|---|---|---|
| KR | 10-2005-0056223 | 6/2005 |
| KR | 10-2011-0139646 | 12/2011 |
| KR | 10-2012-0068701 | 6/2012 |
| WO | WO 2004/055884 | 7/2004 |
| WO | WO 2013/007654 | 1/2013 |

OTHER PUBLICATIONS

Chinese Office Action dated Mar. 31, 2016 from corresponding Chinese Patent Application No. 201310224034.4, 8 pages.

* cited by examiner

POWER SEMICONDUCTOR DEVICE AND METHOD OF FABRICATING THE SAME

CROSS-REFERENCE TO RELATED APPLICATIONS

This application claims the priority of Korean Patent Application No. 10-2013-0020713 filed on Feb. 26, 2013, in the Korean Intellectual Property Office, the disclosure of which is incorporated herein by reference.

BACKGROUND OF THE INVENTION

1. Field of the Invention

The present invention relates to a power semiconductor device and a method of fabricating the same.

2. Description of the Related Art

An insulated gate bipolar transistor (IGBT) is a transistor having a gate fabricated using metal oxide semiconductor (MOS) and having bipolarity by forming a p-type collector layer on a rear surface thereof.

Since a power metal oxide semiconductor field effect transistor (MOSFET) has been developed, the MOSFET has been used in a region requiring high-speed switching characteristics.

However, since the MOSFET has structural limitations, a bipolar transistor, a thyristor, gate turn-off thyristors (GTOs), and the like, have been used in regions requiring high voltage.

The IGBT has characteristics such as a low forward loss and high-speed switching, and therefore has been expanded into fields that cannot be realized by the existing thyristor, bipolar transistor, metal oxide semiconductor field effect transistor (MOSFET), and the like.

Reviewing an operational principle of the IGBT, when the IGBT device is turned on, an amount of voltage higher than that applied to a cathode is applied to an anode and an amount of voltage higher than the threshold voltage of the device is applied to a gate electrode, such that a polarity of a surface of a p-type body region located in a lower portion of the gate electrode is reversed, thereby forming an n-type channel.

Electronic current injected into a drift region through a channel induces the injection of hole current from a high-concentration p-type collector layer located in a lower portion of the IGBT device, like a base current of the bipolar transistor.

Due to the high-concentration injection of minority carriers, conductivity modulation, by which conductivity in the drift region is increased tens to hundreds of times, occurs.

Unlike the MOSFET, a resistance component in the drift region is very low due to the conductivity modulation, such that the IGBT may have very high voltages applied thereto.

Current flowing in the cathode is divided into electronic current flowing through a channel and hole current flowing through a junction between the p-type body and the n-type drift region.

The IGBT has a pnp structure between the anode and the cathode in terms of the substrate structure and does not have a diode embedded therein, unlike the MOSFET, such that separate diodes need to be connected to each other in an antiparallel manner.

The IGBT has main characteristics, such as the maintenance of blocking voltage, the reduction in a conduction loss, and the increase in a switching speed.

In the related art, the magnitude in voltage required for the IGBT tends to be increased, and the durability of the device needs to be increased accordingly.

However, as the device is miniaturized, a latch-up occurs due to the device structure when the magnitude in voltage is increased, such that the device may be easily broken.

The latch-up means that when a pnpn parasitic thyristor structurally present in the IGBT is operated, the IGBT may no longer be controlled by a gate, and thus a large amount of current flows to the IGBT to overheat and break the device.

In addition, as the device is miniaturized, a short circuit occurs in the IGBT.

The short circuit, which mainly occurs in the case of a load connected to the device, for example, an inductive load such as a motor, means the case in which the gate is applied with current in the state in which high voltage is applied to the IGBT and thus high voltage and large current are simultaneously applied to the IGBT.

A short circuit immunity of the IGBT is evaluated as the time for which the device is kept in the foregoing short circuit state without being broken.

Therefore, in order to secure miniaturization and reliability of the IGBT, a need exists for a method for securing robustness for the latch-up and increasing short circuit immunity.

The following related art document discloses the invention relating to an insulated gate bipolar transistor (IGBT).

However, the invention of the following related art document does not include a segregation stop layer formed on a surface of a gate oxide film like the present invention, and does not disclose a structure for increasing a channel length formed on a surface of a gate when a device is turned on, and therefore is different from the present invention.

RELATED ART DOCUMENT

Korean Patent Laid-Open Publication No. 2012-0068701

SUMMARY OF THE INVENTION

An aspect of the present invention provides a power semiconductor device further including a segregation stop layer formed on a surface of a gate oxide film.

An aspect of the present invention provides a structure in which a channel length formed on a surface of a gate is increased when a device is turned on.

According to an aspect of the present invention, there is provided a power semiconductor device, including: a first conductive type drift layer; a second conductive type body layer formed on the drift layer; a second conductive type collector layer formed below the drift layer; a first gate formed by penetrating through the body layer and a portion of the drift layer; a first conductive type emitter layer formed in the body layer and formed to be spaced apart from the first gate; a second gate covering upper portions of the body layer and the emitter layer and formed as a flat type gate on the first gate; and a segregation stop layer formed between contact surfaces of the first and second gates with the body layer, the emitter layer, and the drift layer.

The segregation stop layer may be formed of silicon nitride (SiN).

A thickness of the segregation stop layer may be 0.1 to 10 nm.

The emitter layer may be formed by injecting a first conductive type impurity thereinto and then performing a heat treatment thereon.

The power semiconductor device may further include: a gate insulating layer formed between the first gate and the second gate.

The power semiconductor device may further include: a first conductive type buffer layer formed between the drift layer and the collector layer.

The power semiconductor device may further include: an emitter metal layer formed on the emitter layer and electrically connected to the emitter layer; and a collector metal layer formed beneath the collector layer and electrically connected to the collector layer.

The first conductive type may be an n-type and the second conductive type may be a p-type.

According to an aspect of the present invention, there is provided a method of fabricating a power semiconductor device, including: preparing a first conductive type drift layer; forming a second conductive type body layer on the drift layer; forming a first gate by penetrating through the body layer and a portion of the drift layer; forming a segregation stop layer on a surface of the first gate; forming a gate insulating layer in the first gate in which the segregation stop layer is formed and filling the first gate with polysilicon; forming a first conductive type emitter layer in the body layer so as to be spaced apart from the first gate; forming a second gate covering upper portions of the body layer and the emitter layer on the first gate, as a flat type gate; and forming a collector layer below the drift layer.

The segregation stop layer may be formed of silicon nitride (SiN).

A thickness of the segregation stop layer may be 0.1 to 10 nm.

In the forming of the emitter layer, a first conductive type impurity may be injected thereinto and then a heat treatment may be performed thereon.

The method of fabricating a power semiconductor device may further include: prior to the forming of the second gate, forming a gate insulating layer between the first gate and the second gate.

The method of fabricating a power semiconductor device may further include: prior to the forming of the collector layer, forming a first conductive type buffer layer between the drift layer and the collector layer.

The method of fabricating a power semiconductor device may further include: after the forming of the second gate, forming an emitter metal layer electrically connected to the emitter layer on the emitter layer; and after the forming of the collector layer, forming a collector metal layer electrically connected to the collector layer beneath the collector layer.

The first conductive type may be an n-type and the second conductive type may be a p-type.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

A power switch may be implemented by a power MOSFET, an IGBT, various types of thyristor, or the like. Most new technologies disclosed herein are described with reference to an IGBT. However, several embodiments of the present invention disclosed herein are not limited to the IGBT, but may also be applied to another type of power switch technologies including a power MOSFET and various types of thyristor, for example, in addition to a diode. In addition, several embodiments of the present invention are described as including specific p-type and n-type regions. However, it is natural that the embodiments may be identically applied to a device of which conductive types of several regions disclosed herein are opposite.

Further, an n-type and a p-type used herein may be defined as a first conductive type or a second conductive type. Meanwhile, the first conductive type and the second conductive type refer to different conductive types.

In general, '+' refers to a high concentration doping state and '−' refers to a low concentration doping state.

Figure 1:
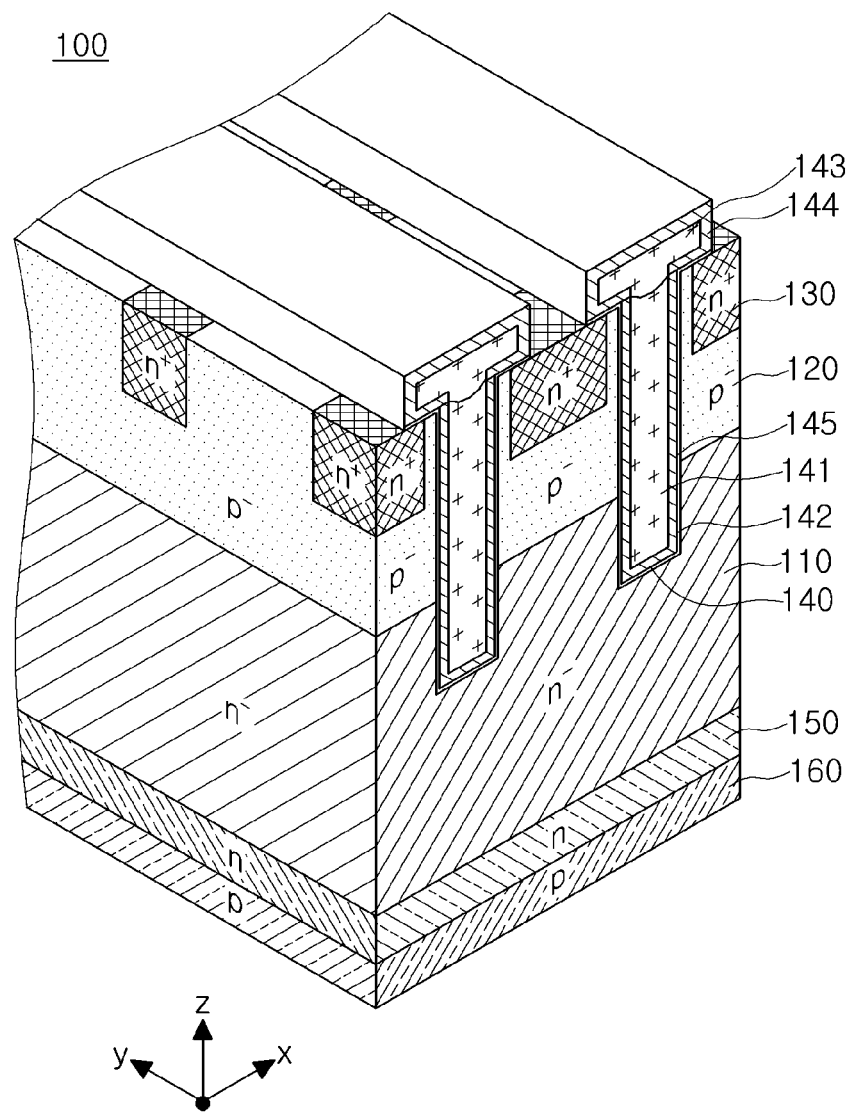
FIG. 1 is a schematic perspective view of a power semiconductor device according to an embodiment of the present invention.
Figure 2:
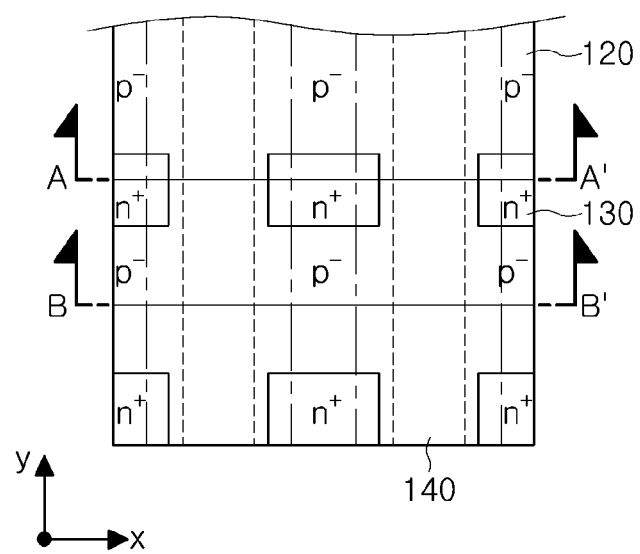
FIG. 2 is a schematic plan view of a power semiconductor device according to embodiments of the present invention.

FIG. 1 is a schematic perspective view of a power semiconductor device according to an embodiment of the present invention and FIG. 2 is a schematic plan view of a power semiconductor device according to embodiments of the present invention.

Figure 3:
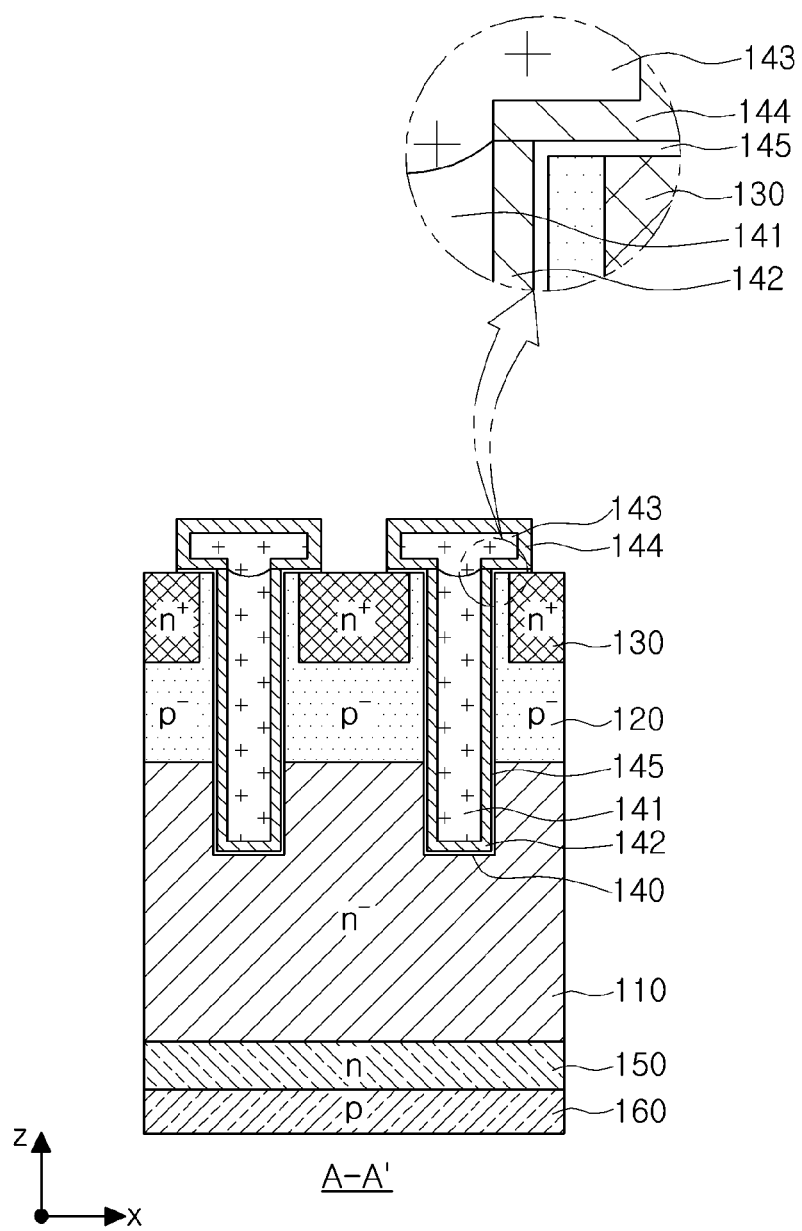
FIG. 3 is a cross-sectional view of line A-A' of FIG. 2 according to the embodiment of the present invention.
Figure 4:
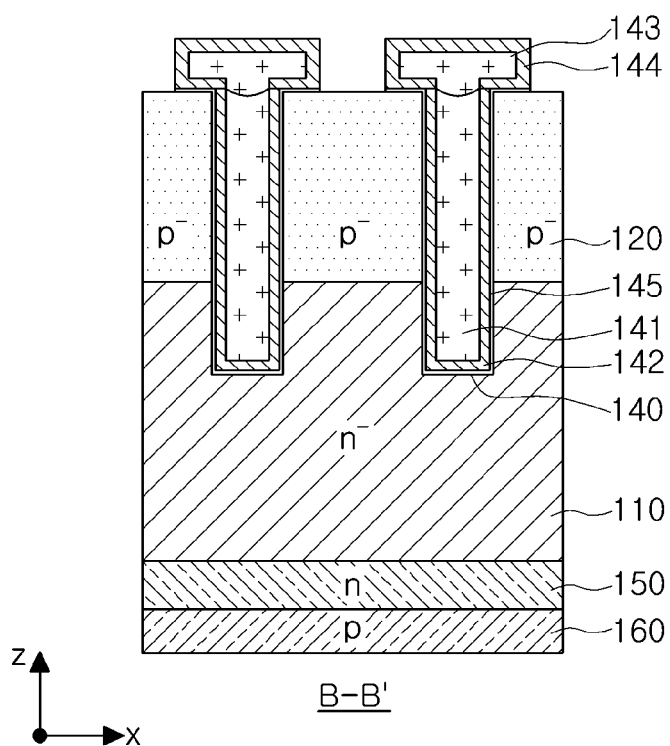
FIG. 4 is a cross-sectional view of line B-B' of FIG. 2 according to the embodiment of the present invention.

FIG. 3 is a cross-sectional view of line A-A' of FIG. 2 according to the embodiment of the present invention and FIG. 4 is a cross-sectional view of line B-B' of FIG. 2 according to the embodiment of the present invention.

Hereinafter, the power semiconductor device according to the embodiment of the present invention will be described with reference to FIGS. 1 through 4.

A power semiconductor device 100 according to the embodiment of the present invention may include a first conductive type drift layer 110; a second conductive type body layer 120 formed on the drift layer 110; a second conductive type collector layer 160 formed below the drift layer 110; a first gate 140 formed to penetrate through the body layer 120 and a portion of the drift layer 110; a first conductive type emitter layer 130 formed in the body layer 120 and formed to be spaced apart from the first gate 140; a second gate 143 covering upper portions of the body layer 120 and the emitter layer 130 and formed as a flat type gate on the first gate 140; and a segregation stop layer 145 formed between contact surfaces of the first and second gates 140 and 143 with the body layer 120, the emitter layer 130, and the drift layer 110.

An ideal blocking voltage of the power semiconductor device is basically determined by a thickness of the drift layer 110 and a concentration of impurities therein.

There is a need to increase the thickness and reduce the concentration of impurities in order to improve the blocking voltage. In this case, Vce (sat) of the power semiconductor device is increased, and therefore, the appropriate conditions are required.

Further, since processing for relieving an electric field concentration at a chip edge and keeping blocking voltage by a raw material is required, the power semiconductor device according to the embodiment of the present invention may include an electric field limiting ring (not illustrated).

The body layer 120 has a second conductive type and may be formed on the drift layer 110.

The body layer 120 may be formed on the drift layer 110 by an epitaxial method.

The first gate 140 may be formed by penetrating through the body layer and a portion of the drift layer by using a photoresist.

Surfaces of the first gate 140 in contact with the drift layer 110 and the body layer 120 may have a gate insulating layer 142 and the segregation stop layer 145 formed thereon.

An inside of the first gate 140 may be filled with polysilicon or metal.

When the device is turned on, the first gate 140 may form a channel in the body layer 120 contacting the first gate 140.

The emitter layer 130 has a first conductive type and may be formed in an upper portion of the body layer 120 and formed to be spaced apart from the first gate 140.

The second gate 143 covers a portion of the upper portion of the emitter layer 130 and may be formed as a flat type gate on the first gate 140.

In addition, the contact surfaces of the emitter layer 130 and the body layer 120 with the second gate may be formed with a gate insulating layer 144 and the segregation stop layer 145.

An inside of the second gate 143 may be filled with polysilicon or metal.

When the device is turned on, the second gate 143 may form a channel in the body layer 120 located at a portion at which the first gate and the emitter layer 130 are spaced apart from each other.

Since the gate 140 of the power semiconductor device has metal oxide semiconductor (MOS) form, the power semiconductor device according to the embodiment of the present invention is operated by forming a channel in the body layer to follow a path such as that of a dotted line of FIG. 3 when the voltage is applied to the gate 140.

That is, when the gate electrode electrically connected with polysilicon or metal in the gate 140 is applied with voltage higher than threshold voltage of the device, the channel is formed by reversing a polarity of the surface of the body layer 120 in a lower portion of the electrode, and thus is operated as a transistor.

In the power semiconductor device according to the embodiment of the present invention, the emitter layer 130 may be formed to be spaced apart from the first gate 140.

Therefore, when the device is turned on, a channel length formed in the body layer 120 may be longer than that of the power semiconductor device of the related art.

That is, referring to an enlarged view of FIG. 3, a channel is formed in a region between a dotted line and the first gate 140, such that the channel length may be longer than that of the case in which the power semiconductor device of the related art is formed through the emitter layer 130 being in contact with the first gate 140.

When the channel length is increased, the overall resistance of the channel may be increased.

When the resistance of the channel is increased, short circuit immunity is increased, such that reliability may be secured in the power semiconductor device.

Generally, the gate insulating layers 142 and 144 are formed using silicon oxide ($SiO_2$) and impurities of the body layer 120 are controlled by injecting boron.

When the silicon oxide ($SiO_2$) contacts the boron of the body layer 120, the segregation phenomenon of boron from the surface of the silicon oxide ($SiO_2$) occurs.

In the case of the embodiment of the present invention, in the structure for increasing channel length, the segregation phenomenon of boron may be significant in a bent portion at a point at which the first gate and the second gate meet each other.

As the segregation phenomenon of boron is increased, the gate conduction voltage Vth has a lowest value at a point at which the first gate and the second gate meet each other.

In other words, the Vth is not constant along the channel formed when the device is turned on, which means that the instability of the Vth is increased due to the flow of high current when the power semiconductor device with the increased channel length is operated in a short circuit mode.

The instability of the Vth may further increase the ripple phenomenon of collector current, which may lead to an instable state of the short circuit immunity of the power semiconductor device.

Therefore, the segregation stop layer 145 is disposed between the gate 140 and the body layer 120 at the contact surface, such that the stability of short circuit immunity may be secured.

The segregation stop layer 145 may be formed of a material preventing impurities injected into the body layer 120 from being segregated, but the embodiment of the present invention is not limited thereto.

The segregation stop layer 145 may be formed of silicon nitride (SiN).

According to the embodiment of the present invention, when a double layer of silicon nitride and silicon oxide is formed between the gate 140 and the body layer 120, the instability of the Vth may be reduced.

That is, the segregation stop layer 145 prevents boron from being segregated as silicon oxide, such that the Vth value may be constant along the channel when the device is turned on.

Further, gate capacitance is further reduced than in the case of the existing structure, by using silicon nitride.

Therefore, the Vth may be increased with the reduction in gate capacitance.

A thickness of the segregation stop layer 145 may be 0.1 to 10 nm.

The electronic current injected through the channel formed in the body layer 120 when the device is turned on induces the injection of the hole current from the collector layer 160 to provide the high-concentration injection of minority carriers, such that conductivity modulation increasing the conductivity of the drift layer 110 from tens of times to hundreds of times occurs.

Therefore, the resistance component in the drift layer 110 is very low due to the conductivity modulation, such that high voltage may be applied to the power semiconductor device.

The gate insulating layer 144 may be further provided between the first gate 140 and the second gate 143.

Figure 5:
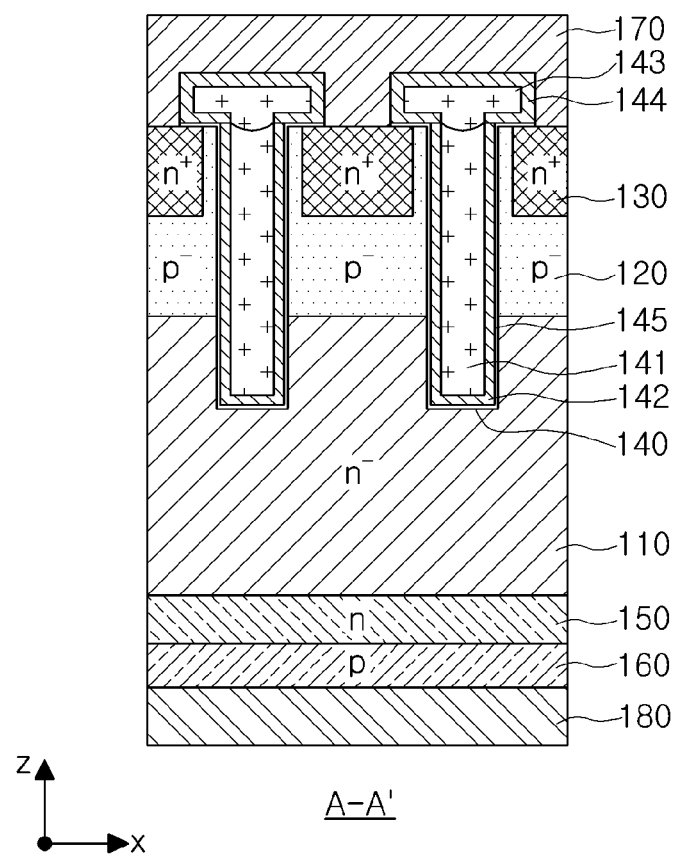
FIG. 5 is a cross-sectional view of line A-A' of FIG. 2 according to another embodiment of the present invention.

FIG. 5 is a cross-sectional view of line A-A' of FIG. 2 according to another embodiment of the present invention.

Referring to FIG. 5, a power semiconductor device according to another embodiment of the present invention may further include a first conductive type buffer layer 150 between the drift layer 110 and the collector layer 160.

The buffer layer 150 may provide a field stop function.

Therefore, in the power semiconductor device according to the embodiment of the present invention, a thickness of the drift layer 110 may be further reduced in the same blocking voltage condition as compared with the case in which there is no buffer layer 150.

The power semiconductor device may further include an emitter metal layer 170 formed on the emitter layer 130 and electrically connected to the emitter layer 130 and a collector metal layer 180 formed beneath the collector layer 160 and electrically connected to the collector layer 160.

Figure 6:
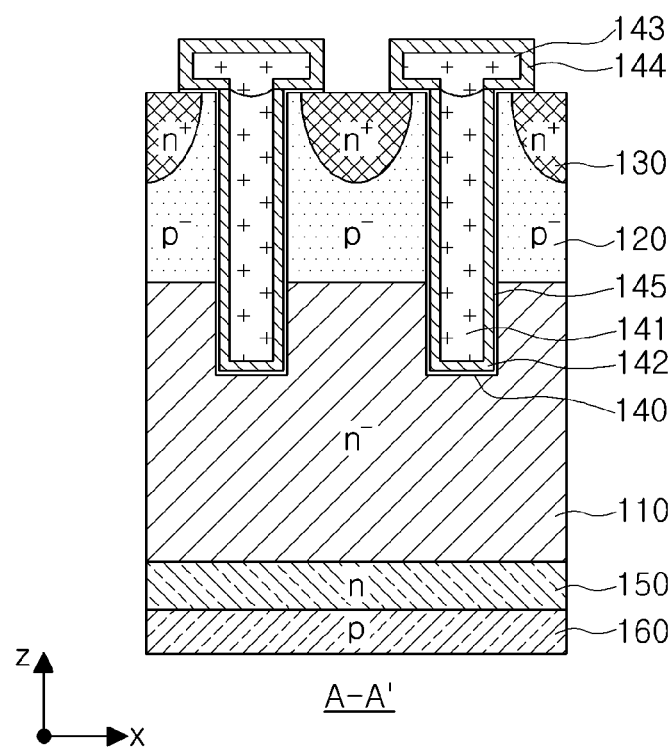
FIG. 6 is a cross-sectional view of line A-A' of FIG. 2 according to another embodiment of the present invention.

FIG. 6 is a cross-sectional view of line A-A' of FIG. 2 according to another embodiment of the present invention.

Referring to FIG. 6, the emitter layer 130 of a power semiconductor device according to another embodiment of the present invention may be formed by injecting a first conductive type impurity thereinto and then performing a heat treatment thereon.

That is, a diffusion depth of the injected impurity may be controlled by injecting the first conductive type impurity thereinto and then performing the heat treatment thereon.

For example, when the emitter layer 130 is formed by injecting a sufficient amount of first conductive type impurities and increasing the heat treatment time, the diffusion is performed spherically from the injection spot, such that a contact distance between the emitter layer 130 and the gate 140 may be gradually lengthened.

In other words, gradually increasing the contact distance between the gate 140 and the emitter layer 130 is equivalent to reducing the channel length when the device is turned on.

Therefore, in the power semiconductor device according to another embodiment of the present invention, the injection amount of the first conductive type impurity and the heat treatment time are controlled in order to control the length of the channel formed when the device is turned on.

Further, in respective embodiments of the present invention, the gate insulating layer may be further disposed between the first gate and the second gate.

The gate insulating layer is provided between the first gate and the second gate, such that the first gate and the second gate may be configured to be operated independently on one another.

Therefore, short circuit immunity may be improved by controlling resistance or current as needed.

FIGS. 7A-7H illustrate a schematic process of fabricating the power semiconductor device according to the embodiment of the present invention.

Referring to FIGS. 7A-7H, a method of fabricating a power semiconductor device according to an embodiment of the present invention may include: preparing the first conductive type drift layer 110 (FIG. 7A); forming the second conductive type body layer 120 on the drift layer 110 (FIG. 7B); forming the first gate 140 formed to penetrate through the body layer 120 and a portion of the drift layer 110 (FIG. 7C); forming the segregation stop layer 145 on the surface of the first gate 140 (FIG. 7C); forming the gate insulating layer 142 on the first gate 140 on which the segregation stop layer 145 is formed (FIG. 7D) and filling the first gate 140 with a material 141 that is polysilicon or metal (FIG. 7E); forming the first conductive type emitter layer 130 in the body layer 120 so as to be spaced apart from the first gate 140 (FIG. 7F); forming the second gate 143 covering upper portions of the body layer 120 and the emitter layer 130 and forming as a flat type gate on the first gate 140 (FIG. 7F); and forming the collector layer 160 below the drift layer 110.

In the forming of the body layer 120 (FIG. 7B), the body layer 120 may be performed by an epitaxial method.

The body layer 120 is formed by the epitaxial method, and thus may be grown until reaching an appropriate height.

The first gate (FIG. 7C) may be formed by being etched to penetrate through the body layer 120 and a portion of the drift layer 110 by using a mask.

The segregation stop layer 145 (FIG. 7C) may be formed using a chemical vapor deposition (CVD).

The segregation stop layer 145 (FIG. 7C) may be formed using a plasma enhanced chemical vapor deposition (CVD) process.

The segregation stop layer 145 may be formed of silicon nitride (SiN).

The thickness of the segregation stop layer 145 may be 0.1 to 10 nm.

In the forming of the emitter layer 130 (FIG. 7F), the emitter layer 130 may be formed to be spaced apart from the first gate 140.

Therefore, when the device is turned on, a channel length formed in the body layer 120 may be longer than that of the power semiconductor device of the related art.

When the channel length is increased, the overall resistance of the channel may be increased, and when the resistance of the channel is increased, short circuit immunity may be increased, thereby securing the reliability of the power semiconductor device.

In the forming of the emitter layer 130 (FIG. 7F), the first conductive type impurity is injected into the emitter layer 130 and then the heat treatment may be performed thereon.

The first emitter layer 130 is injected with the first conductive type impurity and then subjected to the heat treatment, such that the injected impurity may be diffused.

Therefore, the channel length may be controlled by appropriately controlling the injected amount of impurities and the heat treatment time and the resistance of the channel may be also controlled.

Prior to the forming of the second gate 143 (FIG. 7F), the method of fabricating a power semiconductor device may further include forming the gate insulating layer 144 between the first gate 140 and the second gate 143.

Polysilicon or metal may be prevented from being diffused into an unwanted portion by forming the gate insulating layer 144 between the first gate 140 and the second gate 143.

That is, in order to increase the channel length when the device is turned on, the first gate 140 and the second gate 143 need to meet each other substantially at a right angle, such that a phenomenon of collapsing the polysilicon or the metal in a portion at which the first gate 140 meets the second gate 143 during the process of fabricating the power semiconductor device may occur.

Therefore, the polysilicon or the metal may be prevented from collapsing by disposing the gate insulating layer 144 between the first gate 140 and the second gate 143.

Figure 7A:
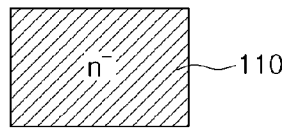
FIGS. 7A-7H illustrate a schematic process of fabricating the power semiconductor device according to the embodiment of the present invention.
Figure 7B:
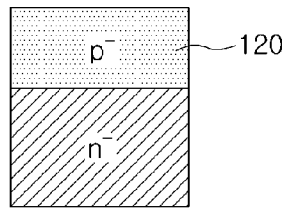
Figure 7C:
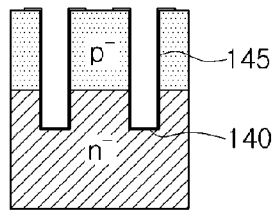
Figure 7D:
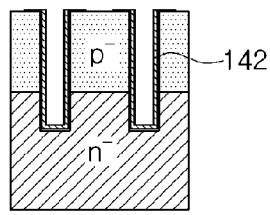
Figure 7E:
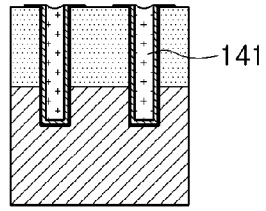
Figure 7F:
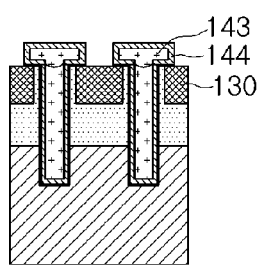
Figure 7G:
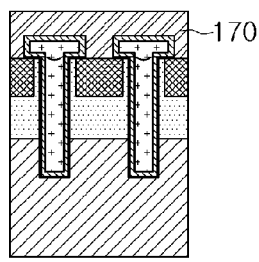

The method of fabricating a power semiconductor device may further include forming the emitter metal layer 170 electrically connected to the emitter layer 130 on the emitter layer 130 (FIG. 7G) after the forming of the second gate 143 (FIG. 7F).

Figure 7H:
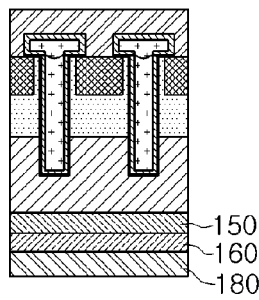

After the forming of the emitter metal layer 170, a rear surface of the body layer 110 may be appropriately removed (FIG. 7H).

The removing of the rear surface of the body layer 110 (FIG. 7H) may be performed by using grinding.

The blocking voltage may be controlled and the thinness of the device may be promoted, by reducing the thickness of the body layer 110.

The method of fabricating a power semiconductor device may further include forming the first conductive type buffer layer 150 (FIG. 7H) beneath the body layer 110 after the rear surface of the body layer 110 is removed.

The buffer layer 150 may be formed by injecting the first conductive type impurity.

After the forming of the buffer layer 150 (FIG. 7H), the collector layer 160 may be formed beneath the buffer layer 150 (FIG. 7H).

The method of fabricating a power semiconductor device may further include forming the collector metal layer 180 to be electrically connected to the collector layer 160 beneath the collector layer 160, after the forming of the collector layer 160 (FIG. 7H).

As set forth above, according to the embodiment of the present invention, the resistance of the channel may be increased by having the structure in which the channel length formed on the surface of the gate is increased when the device is turned on.

Therefore, the short circuit immunity of the power semiconductor device may be increased and the reliability of the power semiconductor device may be improved.

Further, the boron segregation phenomenon occurring according to the increase in the channel length is prevented by further including the segregation stop layer formed on the surface of the gate oxide film, such that the instability of the gate conduction voltage Vth may be prevented.

Since the instability of the gate conduction voltage Vth is prevented, the ripple phenomenon of the collector current is prevented, such that the stability of the power semiconductor device may be improved.

Further, the gate permittivity is more reduced than that of the case of only using the existing gate oxide film, by forming the segregation stop layer on the surface of the gate oxide film, such that the gate conduction voltage Vth may be increased.

While the present invention has been shown and described in connection with the embodiments, it will be apparent to those skilled in the art that modifications and variations can be made without departing from the spirit and scope of the invention as defined by the appended claims.

What is claimed is:

1. A power semiconductor device, comprising:
a first conductive type drift layer;
a second conductive type body layer formed on the drift layer;
a second conductive type collector layer formed below the drift layer;
a first gate formed by penetrating through the body layer and a portion of the drift layer;
a gate insulating layer formed on the first gate;
a first conductive type emitter layer formed in the body layer, formed to be spaced apart from the first gate, and not in contact with the gate insulating layer;
a second gate covering upper portions of the body layer and the emitter layer and formed as a flat type gate on the first gate; and
a segregation stop layer formed between contact surfaces of the first and second gates with the body layer, the emitter layer, and the drift layer,
wherein all surfaces of the first conductive type emitter layer are not in contact with the gate insulating layer.

2. The power semiconductor device of claim 1, wherein the segregation stop layer is formed of silicon nitride (SiN).

3. The power semiconductor device of claim 1, wherein a thickness of the segregation stop layer is 0.1 to 10 nm.

4. The power semiconductor device of claim 1, wherein the emitter layer is formed by injecting a first conductive type impurity thereinto and then performing a heat treatment thereon.

5. The power semiconductor device of claim 1, wherein the gate insulating layer is formed between the first gate and the second gate.

6. The power semiconductor device of claim 1, further comprising
a first conductive type buffer layer formed between the drift layer and the collector layer.

7. The power semiconductor device of claim 1, further comprising:
an emitter metal layer formed on the emitter layer and electrically connected to the emitter layer; and
a collector metal layer formed beneath the collector layer and electrically connected to the collector layer.

8. The power semiconductor device of claim 1, wherein the first conductive type is an n-type and the second conductive type is a p-type.

9. A method of fabricating a power semiconductor device, comprising:
preparing a first conductive type drift layer;
forming a second conductive type body layer on the drift layer;
forming a first gate by penetrating through the body layer and a portion of the drift layer;
forming a segregation stop layer on a surface of the first gate;
forming a gate insulating layer on the first gate on which the segregation stop layer is formed and filling the first gate with polysilicon;
forming a first conductive type emitter layer in the body layer so as to be spaced apart from the first gate;
forming a second gate covering upper portions of the body layer and the emitter layer on the first gate, as a flat type gate; and
forming a collector layer below the drift layer,
wherein the first conductive type emitter layer is not in contact with the gate insulating layer, such that all surfaces of the first conductive type emitter layer are not in contact with the gate insulating layer.

10. The method of claim 9, wherein the segregation stop layer is formed of silicon nitride (SiN).

11. The method of claim 9, wherein a thickness of the segregation stop layer is 0.1 to 10 nm.

12. The method of claim 9, wherein in the forming of the emitter layer, a first conductive type impurity is injected into the emitter layer and then a heat treatment is performed on the emitter layer.

13. The method of claim 9, further comprising, prior to the forming of the second gate, forming the gate insulating layer.

14. The method of claim 9, further comprising, prior to the forming of the collector layer, forming a first conductive type buffer layer between the drift layer and the collector layer.

15. The method of claim 9, further comprising:
after the forming of the second gate, forming an emitter metal layer electrically connected to the emitter layer on the emitter layer; and
after the forming of the collector layer, forming a collector metal layer electrically connected to the collector layer beneath the collector layer.

16. The method of claim 9, wherein the first conductive type is an n-type and the second conductive type is a p-type.

* * * * *